(12) United States Patent
Hsu et al.

(10) Patent No.: US 6,954,098 B2
(45) Date of Patent: Oct. 11, 2005

(54) POWER-RAIL ESD CLAMP CIRCUIT FOR MIXED-VOLTAGE I/O BUFFER

(75) Inventors: Kuo-Chun Hsu, Hsinchu (TW); Ming-Dou Ker, Hsinchu (TW)

(73) Assignee: ADMtek Incorporated, Hsinchu (TW)

( * ) Notice: Subject to any disclaimer, the term of this patent is extended or adjusted under 35 U.S.C. 154(b) by 0 days.

(21) Appl. No.: 10/834,852

(22) Filed: Apr. 30, 2004

(65) Prior Publication Data

US 2005/0200396 A1 Sep. 15, 2005

(30) Foreign Application Priority Data

Mar. 12, 2004 (TW) .............................. 93106585 A

(51) Int. Cl.[7] .............................................. H03L 5/00
(52) U.S. Cl. ...................................... 327/313; 361/56
(58) Field of Search ............................... 327/309–310, 327/313, 318, 321; 361/56, 91.1

(56) References Cited

U.S. PATENT DOCUMENTS 6,147,538 A * 11/2000 Andresen et al. ........... 327/309
6,633,468 B1 * 10/2003 Duvvury et al. ............. 361/56

* cited by examiner

*Primary Examiner*—Quan Tra
(74) *Attorney, Agent, or Firm*—Troxell Law Office, PLLC

(57) ABSTRACT

A power-rail ESD clamp circuit for mixed-voltage I/O buffer is proposed. The power-rail ESD clamp circuit comprises an ESD detection circuit and an ESD protection device. Under normal operating condition, the ESD detection circuit will not trigger the ESD protection device, and therefore the component used in the circuit will not have the gate-oxide reliability issue and also will not generate undesirable leakage current. Under ESD-zapping conditions, the ESD detection circuit will provide some trigger voltage or current to bias the ESD protection device. The ESD protection device can be triggered on quickly to discharge the ESD energy efficiently.

15 Claims, 6 Drawing Sheets

Voltage(V)

Time (ns)

POWER-RAIL ESD CLAMP CIRCUIT FOR MIXED-VOLTAGE I/O BUFFER

1. Field of the Invention

The present invention relates to a power-rail ESD clamp circuit for mixed-voltage I/O buffer, and more particularly, to a power-clamp ESD protection circuit with only 1-V and 2.5-V devices to operate at a 3.3-V power supply voltage

2. Background of the Invention

To improve circuit operating speed and performance, the device dimensions of MOSFET have been shrunk in the advanced deep-submicron integrated circuits. In order to follow the constant-field scaling requirement and to reduce the power consumption, the power-supply voltages in ICs have also been scaled downwards. So, most microelectronic systems require the interfacing of semiconductor chips or subsystems with different internal power-supply voltages. With the mix of power-supply voltages, chip-to-chip interface I/O circuits must be designed to avoid electrical overstress across the gate oxide, to avoid hot-carrier degradation on the output devices, and to prevent undesirable leakage current paths between the chips.

Refer to FIG. 1 which is a schematic diagram showing a conventional I/O buffer for an electronic system with independent power supply. As seen in FIG. 1, the electronic system 100 with independent power supply comprises an output stage and an input stage, wherein the VDD used in the internal circuit of the input stage 120 is the same as that used in the internal circuit of the output stage 110, and the VDD is assumed to be 1V hereinafter, and an I/O pad 140 used for receiving signals from other electronic system with different power supply (not shown). Hence, the I/O pad 140 is capable of receiving signals from other electronic system with different independent power supply and feeding the same to the internal circuit of the input stage 120.

Since the thin gate oxide of both the output PMOS 150 and the output NMOS 160 for input electrostatic discharge (ESD) protection is designed to withstand only 1-V, therefore, when an external 3.3-V signal is applied to the I/O pad 140, the output PMOS 150 will cause the leakage current paths from the I/O pad 140 to VDD, and the output NMOS 160 are overstressed by the 3.3-V input signal and will cause gate oxide reliability problem. To solve the gate-oxide reliability issue without using the additional thick gate oxide process (also known as dual gate oxides in some CMOS processes), the stacked-MOS configuration has been widely used in the mixed-voltage I/O buffers, and in the power-rail ESD clamp circuits.

However. Similar condition can be seen in a power-rail ESD circuit for mixed-voltage I/O buffer disposed in ICs. For instance, the electronic system 100 seen in FIG. 1 is an mixed-voltage I/O buffer with different VCC and VDD.

FIG. 2 illustrates an ESD protection device for mixed-voltage I/O buffer against ESD damage. The ESD protection device 200 contains two NMOS transistors 210, 220 stacked in a cascade configuration. The two NMOS transistors are thin-gate oxide device. The drain of the first transistor 210 (top NMOS transistor) is connected to an VCC (3.3-V) and its gate (top gate) is connected to the lower power supply (VDD) in the ESD protection device 200. The source of the first transistor 210 and the drain of the second transistor 220 (bottom NMOS transistor) are merged together. The gate (bottom gate) and the source of the second transistor 220 are connected to the ground plane of the ESD protection device 200. This configuration allows this device to easily solve the issue of thin gate oxide reliability during the normal operation while providing a parasitic lateral NPN for bipolar action during ESD event.

However, the shortcomings of the ESD protection device 200 are that the stacked NMOS transistors 210, 220 have inferior current driven capability, and are less capable of discharging ESD current so as to have worse ESD endurance.

In view of the above description, the present invention provides a power-rail ESD clamp circuit for mixed-voltage I/O buffer not only capable of solving the issue of thin gate oxide reliability, but also with better ESD endurance and faster turn-on speed.

SUMMARY OF THE INVENTION

The primary object of the invention is to provide a power-rail ESD clamp circuit for mixed-voltage I/O buffer comprising an ESD detection circuit and an ESD protection device, wherein the ESD detection circuit further comprises a first resistor, a second resistor, a capacitor, a first PMOS transistor, a second PMOS transistor, a third PMOS transistor, and a first NMOS transistor.

The first resistor has a first end and a second, wherein the first end thereof is connected to a first node coupled to both an I/O pad and a first voltage. The capacitor also has a first end and a second end, wherein the first end thereof is connected to a second node coupled to the second end of the first resistor. The second resistor also has a first end and a second end, wherein the first end thereof is connected to a second voltage. The first PMOS transistor has a gate, a drain and a source, wherein the gate thereof is connected to both a third node and the second resistor, and the drain thereof is connected to a fourth node coupled to the ground, and the source thereof is connected to the second end of the capacitor. The second PMOS transistor also has a gate, a drain and a source, wherein the gate thereof is connected to the second node, and the source thereof is connected to the first node. The third PMOS transistor also has a gate, a drain and a source, wherein the gate thereof is connected to the third node, and the source thereof is connected to the drain of the second PMOS transistor. The first NMOS transistor also has a gate, a drain and a source, wherein the gate thereof is connected to the third node, and the drain is connected to a fifth node coupled to the drain of the third PMOS transistor.

The ESD protection device comprises a first end, a second end and a trigger end, wherein the first end thereof is connected to the first node, and the second end thereof is connected to the fourth node, and the trigger end thereof is connected to the fifth end.

In a preferred embodiment of the present invention, the first PMOS transistor, the second PMOS transistor and the third PMOS transistor are 2.5-V PMOS transistors and the NMOS transistor is a 1-V NMOS transistor.

To prevent the first NMOS transistor from being turn-on under ESD-zapping condition, a second NMOS transistor is being added and disposed between the first NMOS transistor and the ESD protection device according to another preferred embodiment of the present invention. Therefore, the first PMOS transistor, the second PMOS transistor and the third PMOS transistor are 2.5-V PMOS transistors and the NMOS transistor is a 1-V NMOS transistor, or the first PMOS transistor, the second PMOS transistor and the third PMOS transistor are 2.5-V PMOS transistors and the NMOS transistor and the second NMOS transistor are 1-V NMOS transistors.

The ESD protection device is equivalent to a NPN transistor, such that, in a preferred embodiment of the present invention, the ESD protection device can be a field oxide device (FOD), a stacked NMOS configuration, or a silicon controlled rectifier (SCR) with diode string.

To sum up, the present invention provides a provides a power-rail ESD clamp circuit for mixed-voltage I/O buffer not only capable of solving the issue of thin gate oxide reliability, but also with better ESD endurance and faster turn-on speed.

DESCRIPTION OF THE PREFERRED EMBODIMENT

The invention discloses a power-rail ESD clamp circuit for mixed-voltage I/O buffer capable of solving solve the gate-oxide reliability issue and preventing undesirable leakage current paths between the chips without using the additional thick gate oxide process.

In this regard, the present invention provides a power-clamp ESD protection circuit using both thick gate oxide devices and thin gate oxide device simultaneously so as to improve the reliability and the electrical characteristic of the ESD protection circuit.

Figure 1:
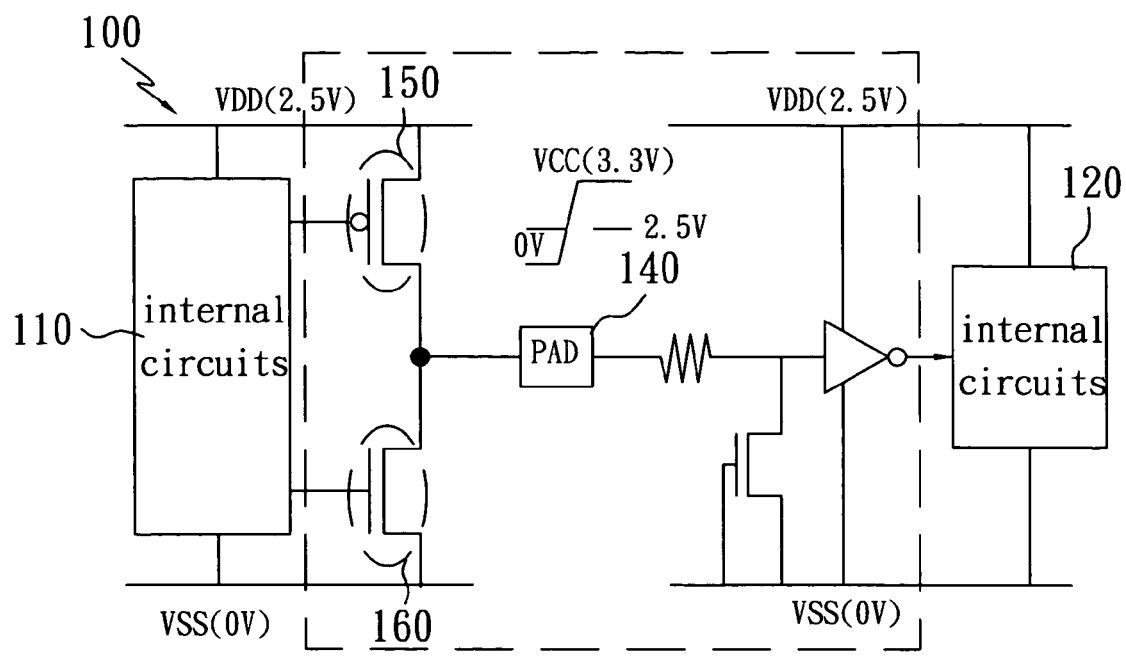
FIG. 1 is a schematic diagram showing a conventional I/O buffer for an electronic system with independent power supply.
Figure 2:
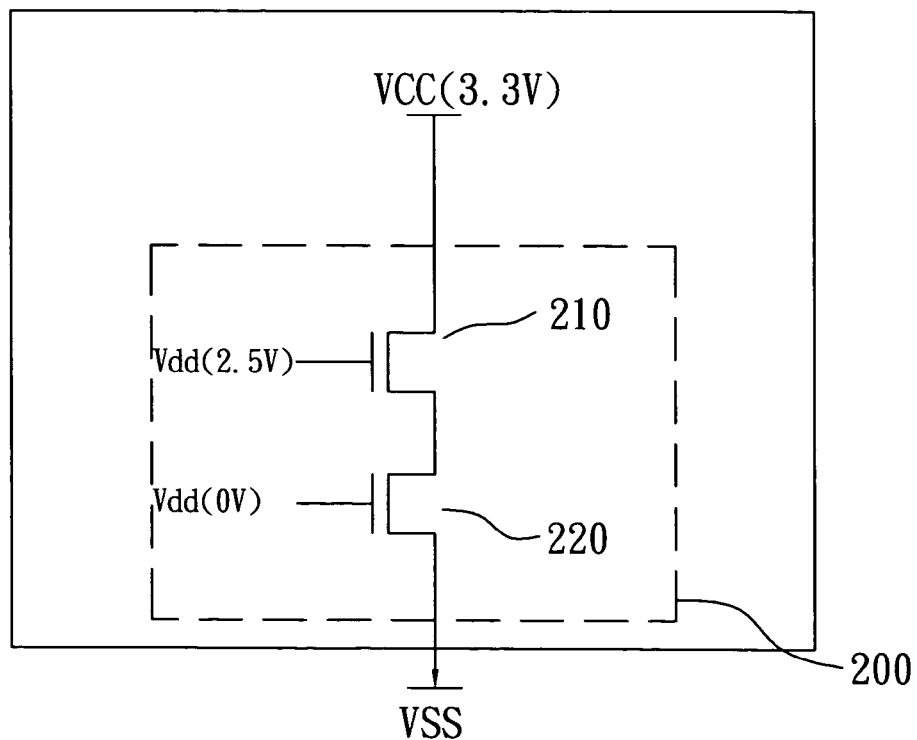
FIG. 2 illustrates an ESD protection device for mixed-voltage I/O buffer against ESD damage.
Figure 3:
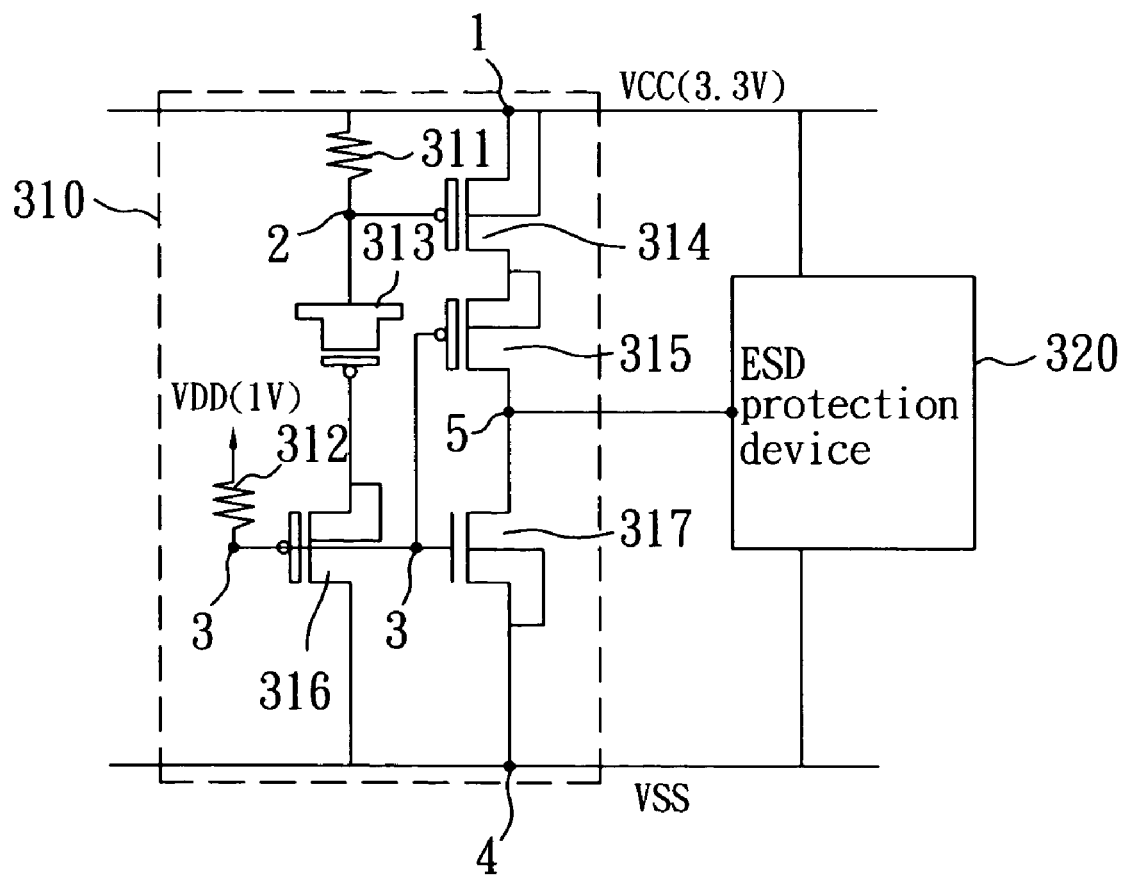
FIG. 3 is a schematic diagram showing a power-rail ESD clamp circuit for mixed-voltage I/O buffer according to a preferred embodiment of the present invention.

Please refer to FIG. 3, which is a schematic diagram showing a power-rail ESD clamp circuit for mixed-voltage I/O buffer according to a preferred embodiment of the present invention. The power-rail ESD clamp circuit as seen in FIG. 3 is consisted of an ESD detection circuit 310 and an ESD protection device 320, wherein the ESD detection circuit 310 further comprises two resistors 311, 312, a capacitor 313, three PMOS transistor 314, 315, 316 and a NMOS transistor 317.

The ESD detection circuit 310 is primarily being used for triggering on the ESD protection device 320 while detecting an ESD-zapping condition between the VCC and the VSS. The function of ESD detection circuit 310 is inactive and doesn't affect the operations of other internal circuits therein under normal operating condition. While an ESD-zapping condition is happening between the VCC and the VSS, the function of ESD detection circuit 310 is active so as to trigger on the ESD protection device 320 quickly and discharge the ESD-generated current.

Assuming the voltage VDD of FIG. 3 is 1V and the voltage VCC of FIG. 3 is 3.3V, and the PMOS transistors are 2.5-V PMOS transistors and the NMOS transistor 317 is a 1-V NMOS transistor, therefore, under normal operating condition, the capacitor 313 is off and the voltage of node 1 coupled to the resistor 311, the VCC and the source of the PMOS transistor 314 is equal to the voltage of node 2 coupled to the capacitor 313 and the gate of the PMOS transistor 314, i.e. 3.3V.

When the 3.3-V power supply is powered on, the voltages at node 1 and node 2 are both 3.3V under normal operating condition, and the voltage at the source of the PMOS transistor 314 is equal to that at the gate of the same that both are smaller than an active voltage, i.e. $|V_{gs}|<|V_t|$, and the gate of the PMOS transistor 314 is biased at 3.3V through the resistor 312. The sources of the PMOS transistor 314 and the PMOS transistor 315 will be biased at ~1V in the steady state because their gates are biased at 1V. Therefore, the PMOS transistor 314 and the PMOS transistor 315 are inactive in the steady state and the NMOS transistor 317 is active since the voltage at node 3 coupled to both the gate of the PMOS transistor 315 and the gate of the NMOS transistor 317 is biased at 1V. The drain of the NMOS transistor 317 coupled to node 4 will be biased at zero voltage due to the conductivity of the NMOS transistor 317 such that the voltage at node 5 coupled to the drain of the PMOS transistor 315, the drain of the NMOS transistor 317 and the trigger end of the ESD protection device 320 will also drop to zero voltage.

Therefore, the voltage at node 5 is 0-V such that the ESD detection circuit 310 will not trigger on the ESD protection device 320. Moreover, The voltage drops on the gate oxides (|Vgs| and |vgd|) of the PMOS transistor 314, 315, and 316, are smaller than 2.5V, and the voltage drops on the gate oxide (|Vgs| and |Vgd|) of the NMOS transistor 317 are smaller than 1V. No gate oxide reliability issue and steady leakage current exist in such power-clamp ESD protection circuit.

When the ESD event is applied to the VCC line with VSS grounded and other nodes are floating, the gate of the PMOS transistor 314 is kept at low voltage level due to the RC delay, so the PMOS transistor 314 is turned on to raise the source voltage of PMOS transistor 315 due to the ESD energy. The RC time constant is designed to distinguish the VDD power-on event (with a rise time of ~ms) from the ESD-stress events (with a rise time of ~ns). During the normal VCC power-on transition (from low to high), the gate voltage of the PMOS transistor 314 can follow up in time with the power-on VCC signal, i.e. the voltage at node 2 can match in time with the power-on VCC signal, so it is biased at VCC and then the PMOS transistor 314 is off. During the ESD transition (from low to high), the gate voltage of the PMOS transistor 314 can not follow up in time with the ESD signal, i.e. the voltage at node 2 is biased at a low voltage level, so the PMOS transistor 314 is on.

The PMOS transistor 315 will be turned on if the |Vgs| of the PMOS transistor 315 is greater than its threshold voltage, so the initial ESD current is discharge from the VCC line through the PMOS transistor 314 and the PMOS transistor 315 to bias the ESD protection device 320. On the other hand, the NMOS transistor 317 is off during the ESD event due to the node 3 is floating and the |Vgs| of the NMOS transistor 317 is smaller than its threshold voltage, in addition, the voltage at node 5 is being kept at a high voltage level.

Therefore, when the ESD event is applied to the VCC line with VSS grounded and other nodes are floating, the ESD detection circuit 310 detects the high voltage at node 5 and triggers on the ESD protection device 320 such that the ESD energy is fully discharged through the ESD protection device 320.

Figure 4:
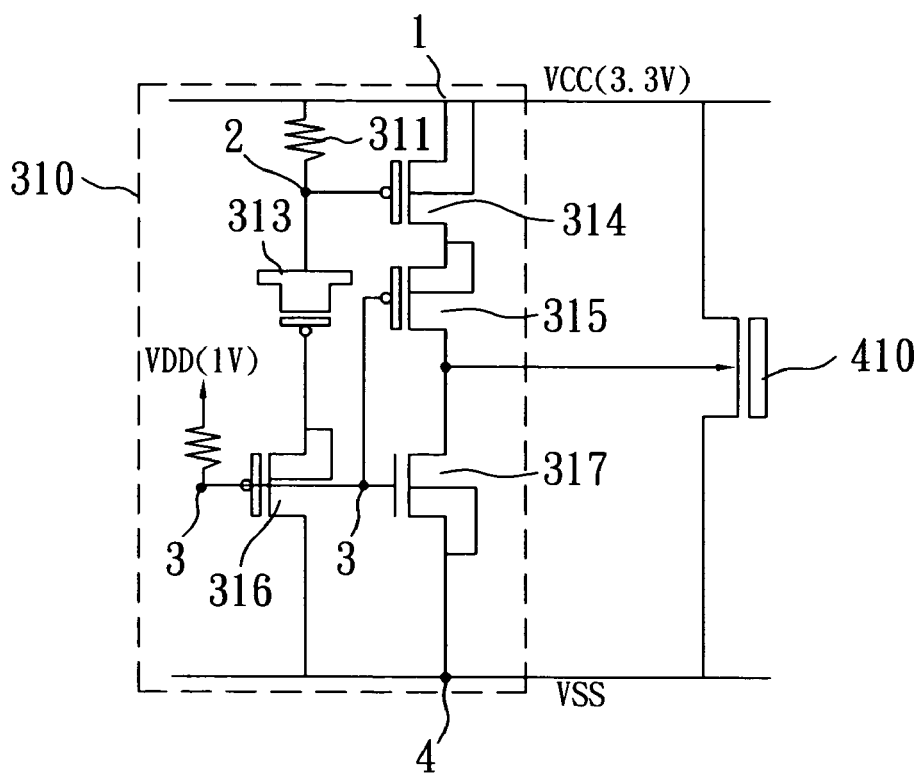
FIG. 4 is another preferred embodiment of the present invention using a FOD as the ESD protection device of FIG. 3

The ESD protection device 320 can be field oxide device (FOD) as seen in FIG. 4, which is another preferred embodiment of the present invention using a FOD as the ESD protection device of FIG. 3. The FOD 410 is connected to the VCC line by one end thereof and to the grounded VSS by another end thereof, and the substrate of the FOD 410 is coupled to the node 5 which is acted as the trigger end of the ESD protection device 320.

Figure 7:
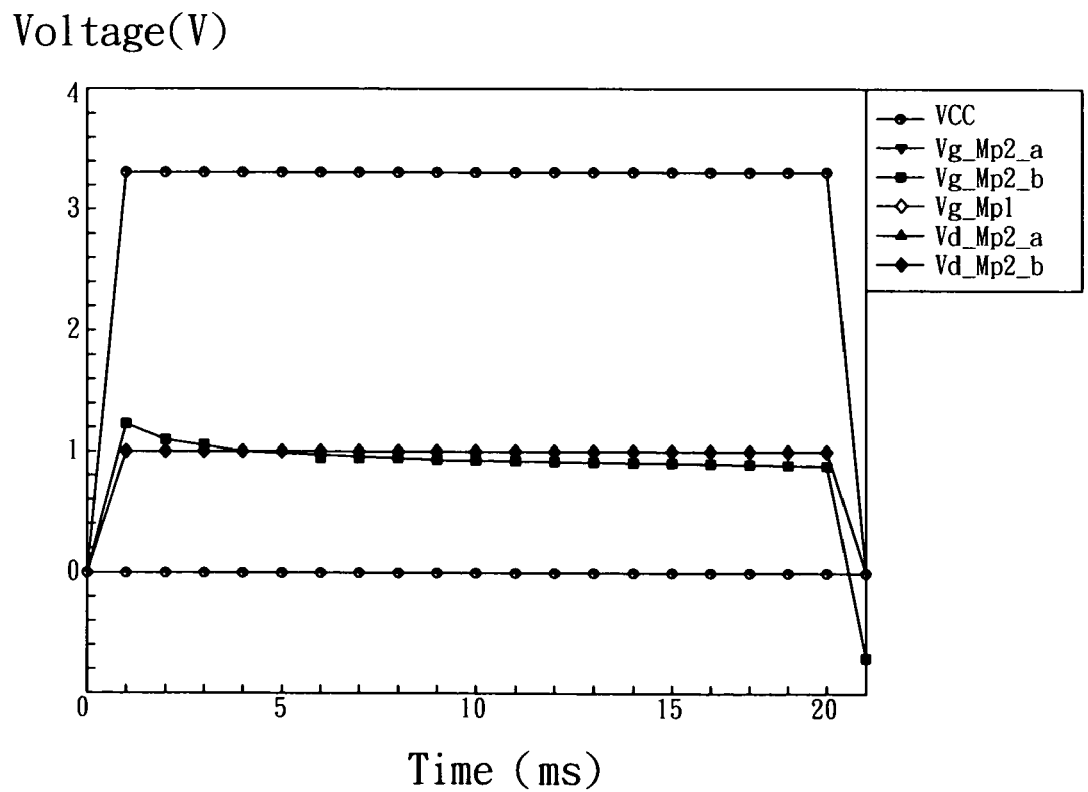
FIG. 7 and FIG. 8 respectively is the spice simulation of FIG. 4 under normal VCC power-on transition and under PS-mode ESD-zapping condition.
Figure 8:
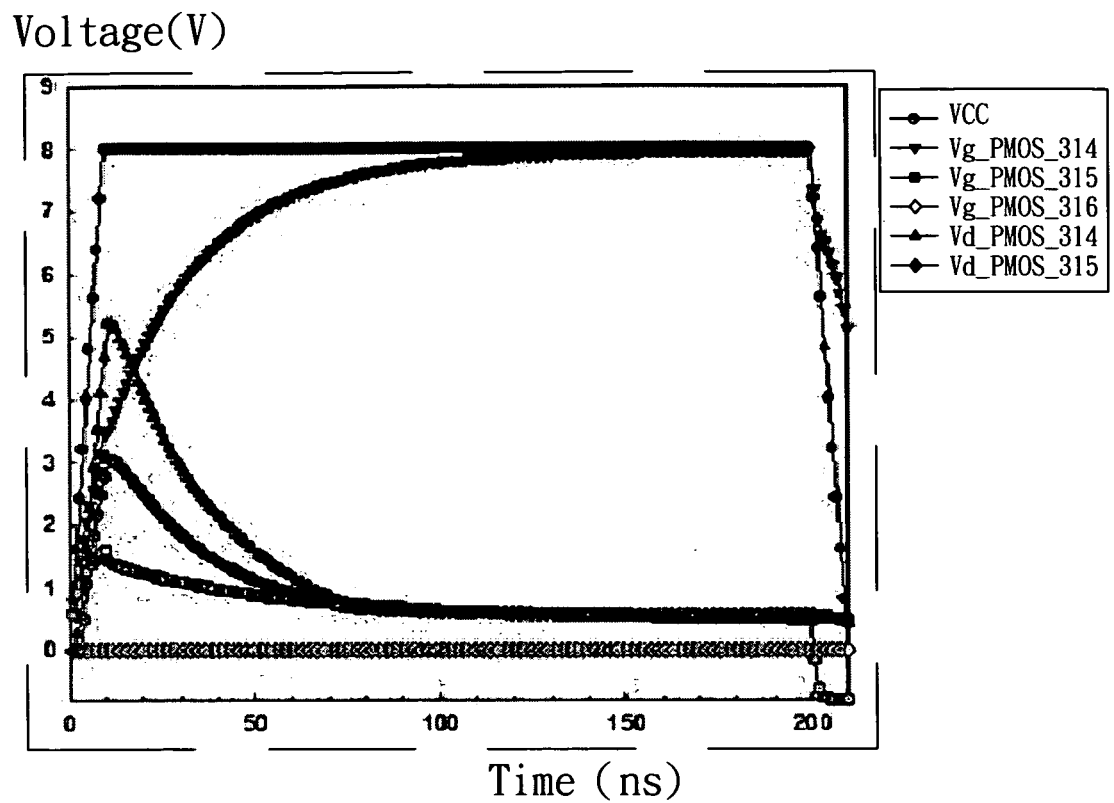

FIG. 7 is the spice simulation of FIG. 4 under normal VCC power-on transition. From the simulation results, the voltage drops on the gate oxides of these devices do indeed not induce the gate oxide reliability issue and steady leakage current problem. FIG. 8 is the spice simulation of FIG. 4 under PS-mode ESD-zapping condition. The drain voltage of the PMOS transistor 315, that is the base voltage of parasitic bipolar transistor, can be raised up to trigger on the bipolar quickly under ESD-zapping condition.

As seen in FIG. 7 where the VCC is 3.3 V, all the drain voltages and the source voltages of the PMOS transistors 314, 315, 316 and the NMOS transistor 317 in steady state will not exceed 1V, therefore, the |Vgs| and |Vgd| of the PMOS transistors 314, 315, 316 are all smaller than 2.5V such that gate oxide reliability issue and steady leakage current problem will not be induced.

As seen in FIG. 8, the drain voltage of the PMOS transistor 315 is raised up promptly to provide a substrate-triggered current such that the parasitic NPN transistor of the FOD 410 is triggered on to quickly discharge the ESD energy Since the ESD current still is possible charge the floated VDD line that enables the NMOS transistor 317 in active state, it is noted that if the NMOS transistor 317 is on during ESD event, the base voltage of parasitic NPN transistor will be pulled down to zero, that is, the voltage at the node 5 is being pulled down to zero, that causes the ESD protection device is hard to trigger on by the ESD detection circuit 310. Therefore, another NMOS transistor is being added to avoid that the unexpected ESD current path will charge up the VDD line to make the NMOS transistor 317 on as seen in FIG. 5.

Figure 5:
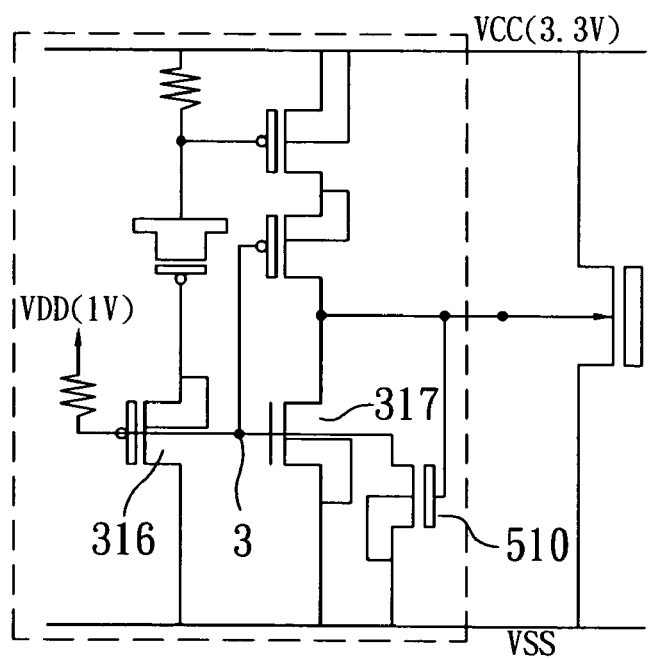
FIG. 5 is a schematic diagram showing a power-rail ESD clamp circuit for mixed-voltage I/O buffer according to another preferred embodiment of the present invention.

Please refer to FIG. 5, which is a schematic diagram showing a power-rail ESD clamp circuit for mixed-voltage I/O buffer according to another preferred embodiment of the present invention. When the ESD event is applied to the VCC line with VSS grounded and other nodes are floating, the unexpected ESD current path charges up the VDD line to make the voltage at the node 3 is at a high voltage level, the NMOS transistor 510 is on to pull down the voltage level of the node 3 to zero voltage level to avoid the NMOS transistor 317 being turned on unexpectedly.

Since the NMOS transistor 510 is being arranged between the VCC line and the grounded VSS to avoid the NMOS transistor 317 being turned on unexpectedly, the NMOS transistor 510 not only can be a thick gate oxide NMOS transistor with high threshold voltage, but also can be a thin gate oxide NMOS transistor with lower threshold voltage so as to be turned on easier and faster. Please refer to FIG. 6, which is a schematic diagram showing a power-rail ESD clamp circuit using a thin gate oxide NMOS transistor 610 instead of the thick gate oxide NMOS transistor 510 of FIG. 5. The thin gate oxide NMOS transistor 610 with lower threshold voltage of FIG. 6 is easier to be turned on during ESD events.

In addition, the ESD protection device 320 not only can be a field oxide device (FOD), but also can be a stacked NMOS configuration, or a silicon controlled rectifier (SCR).

Figure 9:
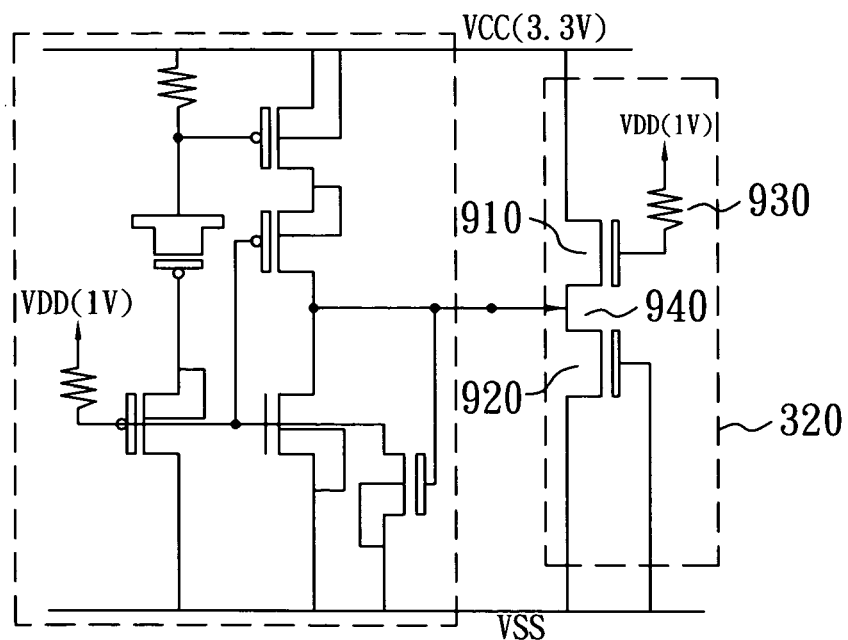
FIG. 9 shows another embodiment of the power-rail ESD protection circuit using where stacked NMOS configuration as the ESD protection device.

FIG. 9 shows another embodiment of the power-rail ESD protection circuit, where the ESD protection device is the stacked NMOS configuration. The stacked NMOS configuration contains two 2.5-V thick gate oxide NMOS transistors 910, 920. The gate of top NMOS transistor 910 is biased at 1V through a resistor 930 and the gate of bottom NMOS transistor 920 is connected to VSS. Under such stacked NMOS configuration, the shared N+ diffusion region 940 will be biased at VDD−Vth_2.5V during normal circuit operating condition. So, the stacked NMOS, the ESD protection device, will not have the gate-oxide reliability issue.

Figure 6:
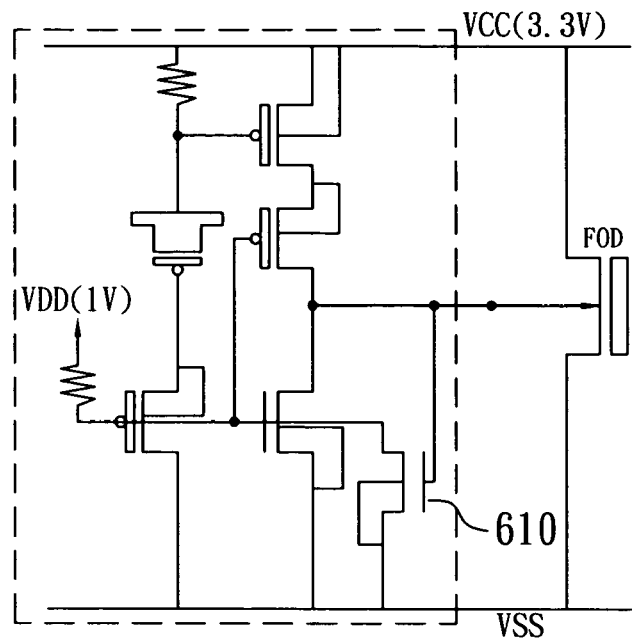
FIG. 6 is a schematic diagram showing a power-rail ESD clamp circuit using a thin gate oxide NMOS transistor instead of the thick gate oxide NMOS transistor of FIG. 5.

However, under ESD-zapping conditions, the ESD detection circuit will provide the substrate-triggered current to trigger on the parasitic NPN inherent in stacked NMOS for bipolar action quickly as well as FIG. 6.

Figure 10:
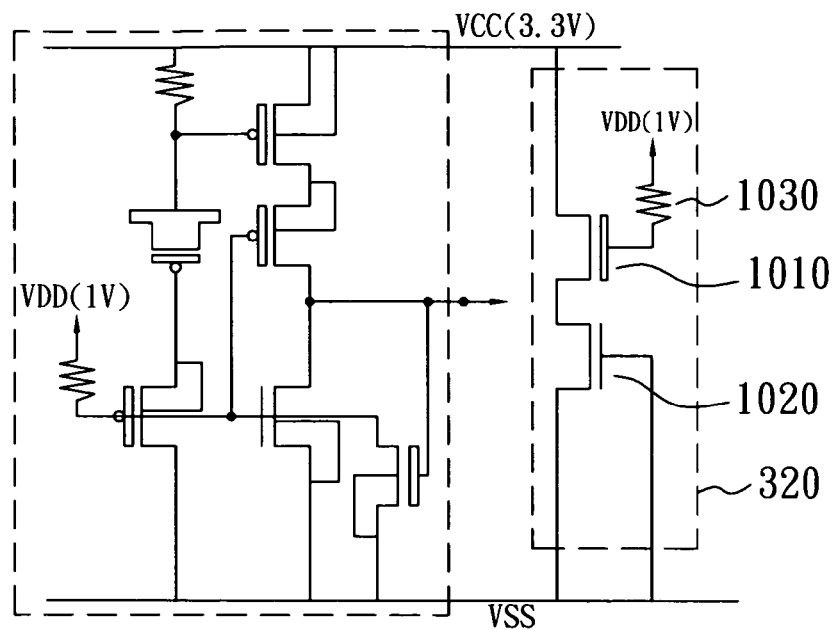
FIG. 10 shows yet another embodiment of the power-rail ESD protection circuit using stacked NMOS configuration as the ESD protection device.

Furthermore, the stacked NMOS configuration can be designed as one 2.5-V NMOS transistor (top) 1010 and one 1-V NMOS transistor (bottom) 1020, which is shown in FIG. 10. Similar to the description of FIG. 9, the shared N+ diffusion region 940 will be biased at 0.7V. Such stacked NMOS configuration also has no gate-oxide reliability issue during normal circuit operating condition and will provide the substrate-triggered current to trigger on the parasitic NPN inherent in stacked NMOS for bipolar action quickly under ESD-zapping conditions.

Figure 11:
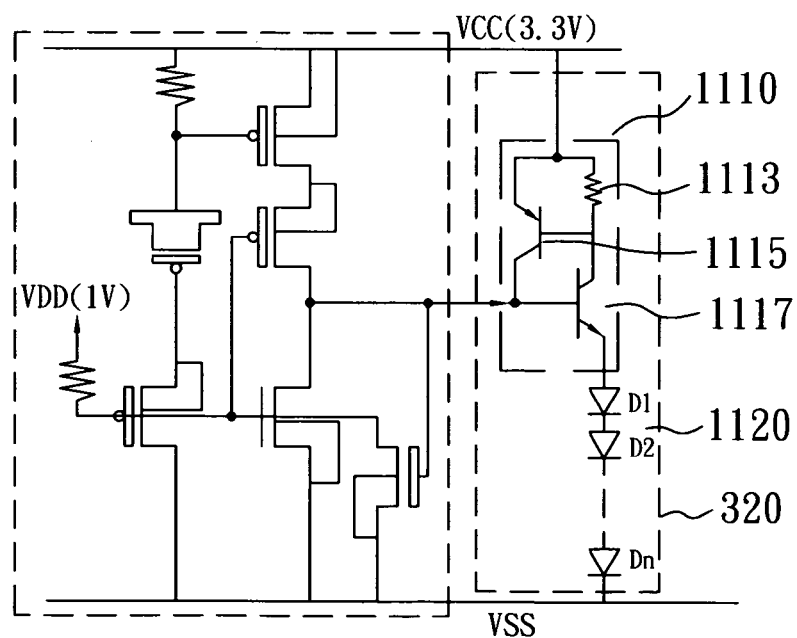
FIG. 11 shows yet another embodiment of the power-rail ESD protection circuit using SCR as the ESD protection device.

FIG. 11 shows the alternative design, where the ESD protection device is the SCR 1110 with diode string 1120. The SCR 1110 is consisted of a resistor 1113, a PNP bipolar transistor 1115 and a NPN bipolar transistor 1117. The diode string 1120 is used to raise the total holding voltage of SCR device 1110 to avoid the latchup issue. The number of diode string is dependent on the maximum power supply voltage. For free to latchup issue, the total holding voltage of ESD protection device must be designed greater than the maximum power supply voltage.

Under normal operating conditions, since the SCR 1110 is primarily consisted of the PNP bipolar transistor 1115 and the NPN bipolar transistor 1117, the gate oxide reliability issue and steady leakage current problem will not be induced.

Under ESD-zapping conditions, the ESD detection circuit 310 also provides the substrate-triggered current to bias the NPN transistor 1117. As long as the base-emitter voltage is over 0.7V, the NPN 1117 will be triggered on and provide the well current to trigger on the PNP transistor 1115. Through the positive-feedback generation mechanism, SCR 1110 can be triggered on at lower trigger voltage level. The ESD current can be discharged through the SCR path and diode string.

From the above description, the power-rail ESD clamp circuit for mixed-voltage I/O buffer of the present invention has advantages as following:
 1. While ESD devices of different specifications are being used in the power-rail ESD clamp circuit for mixed-voltage I/O buffer of the present invention, each the carrying voltage of each ESD devices is within the threshold voltage of the same. Therefore, the gate oxide reliability issue and steady leakage current problem will not be induced.

2. While ESD devices of different specifications are being used in the power-rail ESD clamp circuit for mixed-voltage I/O buffer of the present invention, the design of RC delay of the ESD detection circuit will enable the ESD protection device to be triggered on promptly such that the present invention will have better ESD endurance and electrical characteristics comparing to prior art.

To sum up, the present invention provides a power-rail ESD clamp circuit for mixed-voltage I/O buffer using ESD devices of different specifications and specified layout capable of not only solving the issue of thin gate oxide reliability, but also discharging the ESD energy quickly and having better ESD endurance and electrical characteristics.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A power-rail ESD clamp circuit for mixed-voltage I/O buffer comprising:
   an ESD detection circuit, further comprising:
      a first resistor, having a first end and a second, the first end thereof being connected to a first node coupled to a first voltage;
      a capacitor, having a first end and a second end, the first end thereof being connected to a second node coupled to the second end of the first resistor;
      a second resistor having a first end and a second end, the first end thereof being connected to a second voltage;
      a first PMOS transistor, having a gate, a drain and a source, the gate thereof being connected to both a third node and the second resistor, the drain thereof being connected to a fourth node coupled to a grounded point, the source thereof being connected to the second end of the capacitor;
      a second PMOS transistor, having a gate, a drain and a source, the gate thereof being connected to the second node, the source thereof being connected to the first node;
      a third PMOS transistor, having a gate, a drain and a source, the gate thereof being connected to the third node, the source thereof being connected to the drain of the second PMOS transistor; and
      a first NMOS transistor, having a gate, a drain and a source, the gate thereof being connected to the third node, the drain being connected to a fifth node coupled to the drain of the third PMOS transistor;
   an ESD protection device, further comprising:
      a first end, being connected to the first node;
      a second end, being connected to the fourth node; and
      a trigger end, being connected to the fifth end.

2. The power-rail ESD clamp circuit for mixed-voltage I/O buffer of claim 1, wherein, under normal operating conditions, the first PMOS transistor, the second PMOS transistor and the third PMOS transistor are 2.5-V PMOS transistors.

3. The power-rail ESD clamp circuit for mixed-voltage I/O buffer of claim 2, wherein the first NMOS transistor is an 1_V NMOS transistor.

4. The power-rail ESD clamp circuit for mixed-voltage I/O buffer of claim 1, wherein the first PMOS transistor, the second PMOS transistor and the third PMOS transistor each further comprises a substrate, the substrate thereof being connected to a node coupled to the source of the same.

5. The power-rail ESD clamp circuit for mixed-voltage I/O buffer of claim 1, wherein the ESD detection circuit further comprising:
   a second NMOS transistor, having a gate, a drain and a source, the gate thereof being connected to the fifth node, the drain being connected to the third node, the source thereof being connected to the fourth node.

6. The power-rail ESD clamp circuit for mixed-voltage I/O buffer of claim 5, wherein, under normal operation conditions, the first PMOS transistor, the second PMOS transistor, the third PMOS transistor and the second NMOS transistor are 2.5-V PMOS transistors, and the first NMOS transistor is an 1-V NMOS transistor.

7. The power-rail ESD clamp circuit for mixed-voltage I/O buffer of claim 5, wherein, under normal operation conditions, the first PMOS transistor, the second PMOS transistor, and the third PMOS transistor are 2.5-V PMOS transistors, and the first NMOS transistor and the second NMOS transistor are 1-V NMOS transistors.

8. The power-rail ESD clamp circuit for mixed-voltage I/O buffer of claim 1, wherein the ESD protection device is a NPN bipolar transistor having a collector, a emitter and a base respectively equivalent to the first end, the second end and the trigger end of the ESD protection device.

9. The power-rail ESD clamp circuit for mixed-voltage I/O buffer of claim 8, wherein the ESD protection device is a field oxide device having a substrate, a first end and a second end respectively equivalent to the trigger end, the first end and the second end of the ESD protection device.

10. The power-rail ESD clamp circuit for mixed-voltage I/O buffer of claim 9, wherein under normal operation conditions, the first PMOS transistor, the second PMOS transistor, and the third PMOS transistor are 2.5-V PMOS transistors, the field oxide device is a 2.5-V device and the first NMOS transistor is an 1-V NMOS transistor.

11. The power-rail ESD clamp circuit for mixed-voltage I/O buffer of claim 8, wherein the ESD protection device is consisted of a third NMOS transistor, a fourth NMOS transistor and a third resistor, and the third NMOS transistor has a gate being connected to the voltage through the third resistor, a drain and a source, and the fourth NMOS transistor has a gate being connected to the grounded point, a drain and a source, and the third resistor has a first end connected to the voltage and a second end connected to the gate of the third NMOS transistor, in addition, the drain of the third NMOS transistor acts as the first end of the ESD protection device, and a node coupled to both the gate and the source of the fourth NMOS transistor acts as the second end of the ESD protection device, and a node coupled to the source of the third NMOS transistor and the drain of the fourth NMOS transistor acts as the trigger end of the ESD protection device.

12. The power-rail ESD clamp circuit for mixed-voltage I/O buffer of claim 11, wherein under normal operation conditions, the first PMOS transistor, the second PMOS transistor, the third PMOS transistor, the third NMOS transistor and the fourth NMOS transistor are 2.5-V PMOS transistors, and the first NMOS transistor is an 1-V NMOS transistor.

13. The power-rail ESD clamp circuit for mixed-voltage I/O buffer of claim 11, wherein under normal operation conditions, the first PMOS transistor, the second PMOS transistor, the third PMOS transistor, and the third NMOS transistor are 2.5-V PMOS transistors, and the first NMOS transistor and the fourth NMOS transistor are 1-V NMOS transistors.

14. The power-rail ESD clamp circuit for mixed-voltage I/O buffer of claim 8, wherein the ESD protection device is a silicon controlled rectifier with diode string, the silicon controlled rectifier thereof having a first end used as the first end of the ESD protection device, a second end and a trigger end used as the trigger end of the ESD protection device, and the diode string thereof having a first end connected to the second end of the silicon controlled rectifier and a second end used as the second end of the ESD protection device.

15. The power-rail ESD clamp circuit for mixed-voltage I/O buffer of claim 14, wherein the silicon controlled rectifier comprises:

a fourth resistor, having a first end and a second end;
a PNP bipolar transistor, having a base, a collector, and a emitter, the base thereof being coupled to a sixth node connected to the second end of the fourth resistor, and the emitter thereof being coupled to a node connected to the first end of the fourth resistor where the node is the first end of the silicon controlled rectifier; and
a NPN bipolar transistor, having a base, a collector, and a emitter, the base thereof being coupled to a node connected to the collector of the PNP bipolar transistor where the node is the trigger end of the silicon controlled rectifier, the collector thereof being coupled to the sixth node, and the emitter being connected to the second end of the silicon controlled rectifier.

* * * * *